(12) United States Patent
Baur et al.

(10) Patent No.: US 7,561,925 B2
(45) Date of Patent: Jul. 14, 2009

(54) MOTOR VEHICLE CONTROL DEVICE

(75) Inventors: Richard Baur, Pfaffenhofen (DE); Helmut Rauh, Munich (DE); Jan Urbahn, Ramsey, NJ (US); Marcus Weidner, Weilheim (DE); Klaus Achatz, Gilching (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 119 days.

(21) Appl. No.: 11/414,184

(22) Filed: May 1, 2006

(65) Prior Publication Data

US 2007/0016338 A1 Jan. 18, 2007

Related U.S. Application Data

(63) Continuation of application No. PCT/EP2004/008094, filed on Jul. 17, 2004.

(30) Foreign Application Priority Data

Oct. 30, 2003 (DE) ................................. 103 50 714

(51) Int. Cl.
*G05B 15/00* (2006.01)
*B60T 8/60* (2006.01)

(52) U.S. Cl. ............................... 700/1; 700/83; 303/154

(58) Field of Classification Search ..................... 700/1, 700/83; 701/83; 303/154
See application file for complete search history.

(56) References Cited

U.S. PATENT DOCUMENTS

| 5,809,444 A * | 9/1998 | Hadeler et al. ................. 701/72 |
| 6,424,900 B2 * | 7/2002 | Murray et al. ................. 701/48 |
| 6,441,510 B1 | 8/2002 | Hein et al. |
| 2003/0187519 A1 | 10/2003 | Schlick et al. |

FOREIGN PATENT DOCUMENTS

| DE | 101 07 550 A1 | 9/2002 |
| DE | 101 10 042 A1 | 10/2002 |

OTHER PUBLICATIONS

International Search Report dated Jan. 20, 2005.
German Search Report dated May 18, 2004.

* cited by examiner

*Primary Examiner*—Albert DeCady
*Assistant Examiner*—Thomas H Stevens
(74) *Attorney, Agent, or Firm*—Crowell & Moring LLP

(57) ABSTRACT

A motor vehicle control device is provided with first and second partial devices. The first partial device houses sensors and/or associated functions of the control unit that are identical for all vehicle models in a series. The second partial device houses the sensors and/or functions of the control unit that are additionally required for an individual vehicle.

12 Claims, No Drawings

MOTOR VEHICLE CONTROL DEVICE

CROSS-REFERENCE TO RELATED APPLICATIONS

This application is a continuation of PCT Application No. PCT/EP2004/008094 filed on Jul. 17, 2004, which claims priority to German Application No. 103 50 714.0 filed Oct. 30, 2003, the disclosures of which are incorporated by reference herein.

BACKGROUND AND SUMMARY OF THE INVENTION

The invention relates to a motor vehicle control device having a sensor unit containing several sensors and an associated control unit.

So far, motor vehicle control devices, for example, for controlling the braking system or devices for vehicle occupant protection, have been constructed as a function of the respective vehicle model. In order to meet the requirements of the various equipment variants within one model series, several control devices may even be provided for one model. These several control devices differ with respect to their content, that is, the number of sensors and/or the periphery of their control units. During the running time of one model, they can be used successively with respect to the time and/or isochronously.

For the manufacturer of motor vehicle control devices and the vehicle manufacturer who installs these control devices and/or sells them in the retail trade, this results in high expenditures with respect to the logistics, the storage, and the assembly.

From German Patent document DE 101 07 550 A1, it is known to select the construction of motor vehicle control devices with direction-dependent sensors such that motor vehicle control devices suitable for the different vehicle models and installation positions can be produced at low expenditures. For this purpose, the direction-dependent sensors are arranged in a separate housing, and the sensor housing is installed in a unit housing with an orientation which differs according to the respective demands. However, this does not result in any reduction possibility for a variety of control devices which differ with respect to their contents.

It is an object of the invention to simplify the construction of motor vehicle control devices such that, by means of low expenditures, motor vehicle control devices may be produced which have different contents and which are suitable for the different vehicles of a model series.

The object of the invention is achieved in that the motor vehicle control devices consist of a first and a second partial device, the first partial device housing the sensors and/or associated control unit functions that are identical for all vehicles of a model series, and the second partial device housing the sensors and/or control unit functions that are additionally required for an individual vehicle.

DETAILED DESCRIPTION OF THE PREFERRED EMBODIMENTS

In the case of the invention, the first partial device which, as a rule, has a larger number of functions with respect to the sensors and/or the control unit, is identical for all vehicles of the model series. This results in a partial extent of the control device which has a high functionality and, because of the usually large piece number, a low price, a good quality and reliability. The extent of the second partial device has the following essential characteristics.

As a rule, this second partial device is smaller than that of the first partial device and the size is, therefore, also reduced. This allows for the accommodation of the second partial device at a site most suitable with respect to physical/functional aspects. The implemented division of the functionality makes the entire control device less complex.

This results in greater controllability and a lower development risk coupled with a higher reliability of the overall control device system. This is exhibited, for example, at the interfaces, which can be individually verified and enabled for the two partial devices.

In the most extreme case, the extent of the second partial device may be a null set. This applies when the individual vehicle has minimal equipment/functionality, which also exists in the case of all other vehicles of the model series and if, beyond that, no additional functionality is required for this vehicle.

The second partial device for the second partial functionality can be individually constructed and "made to order" for the respective vehicle in order to cover the additional functional periphery exceeding the minimal equipment.

The second partial devices can also be constructed of a limited number of standard devices which, each separately or partially jointly, can be constructionally combined with the first partial device. Each of these standard devices has, for example, a functional periphery sufficient for the individual vehicle in which it is used. This may be a functional periphery which again is "made to order" and covers the respective additional functional peripheries present in comparison to the minimal equipment, or exceeds the actual additional functional periphery. The following example will illustrate the above.

All vehicles of a model series have functions 1, 2, 3 and 4. In addition, some vehicles have a function 5; other vehicles have a function 6; and finally there are vehicles with the functions 1-6. This situation can be taken into account by a first partial device with the functions 1-4. Different partial devices can be provided for the vehicles with the additional functions 5 and/or 6.

Three partial devices with the functions "5" or "6" or "5 and 6" can be used, and a selection can be made between the three partial devices in the case of the respective vehicle according to the requirements. Or, only a single second partial device having the functions "5 and 6" is provided and used in each case in which the functional periphery exceeds the minimal periphery. In a case where only one of the two additional functions is provided, a greater functional periphery provided by the second partial device is actually required. Since corresponding hardware is provided for the implementation of each function, the possibly larger functional periphery is unimportant.

An advantageous further development of the invention is as follows. The sensors and/or pertaining control unit functionality, which are present for the vehicles of several model series and have the same construction, are present in the first partial device. As a result, only a small development risk still exists in the case of new model lines or series because the first partial device and thus the module with the greater degree of complexity has already proven itself in its operation.

In another embodiment of the invention, the output signals of the first partial device are fed to the second partial device for control purposes and vice-versa. As a rule, it is a prerequisite in this case that also the input signals of the partial device to be controlled are fed to the controlling partial device. This can be achieved without any special connection expenditures if the two partial devices are accommodated in a common housing.

Summarizing, the following advantages are obtained.

As a result of the possibility of constructing the control device in two parts, the respective partial devices can be better placed at a physically correct site. The risk to the success of the process chain with respect to the development, the start of the series, and the series application, which rises as the complexity increases, can be reduced in that only those functional peripheries which differ from other models still have to be developed and readied for the series.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A motor vehicle control device, having a sensor unit, containing several sensors, and an associated control unit, for an individual vehicle produced as a particular model in a vehicle series having a plurality of models, the motor vehicle control device comprising:
    a first partial device comprising the sensors and associated functional interfaces of the control unit included in all of the plurality of models of the vehicle series; and
    a second partial device comprising the sensors and the associated functional interfaces of the control unit required for the individual vehicle in addition to the sensors and associated functional interfaces of the first partial device for all of the plurality of models of the vehicle series.

2. The control device according to claim 1, wherein the sensors and/or associated functional interfaces of the control unit, which are included in vehicles of several model series and have a same construction, are contained in the first partial device.

3. The control device according to claim 2, wherein the first and the second partial devices are arranged in a common housing.

4. The control device according to claim 2, wherein output signals of the first partial device are fed to the second partial device for control purposes.

5. The control device according to claim 4, wherein output signals of the second partial device are fed to the first partial device for control purposes.

6. The control device according to claim 2, wherein output signals of the second partial device are fed to the first partial device for control purposes.

7. The control device according to claim 1, wherein output signals of the second partial device are fed to the first partial device for control purposes.

8. The control device according to claim 7, wherein the first and the second partial devices are arranged in a common housing.

9. The control device according to claim 1, wherein output signals of the first partial device are fed to the second partial device for control purposes.

10. The control device according to claim 9, wherein output signals of the second partial device are fed to the first partial device for control purposes.

11. The control device according to claim 1, wherein the first and the second partial devices are arranged in a common housing.

12. The control device according to claim 9, wherein the first and the second partial devices are arranged in a common housing.

* * * * *